United States Patent
Cai

(10) Patent No.: US 10,027,348 B2
(45) Date of Patent: Jul. 17, 2018

(54) TURBO PRODUCT CODED MODULATION

(71) Applicant: ZTE Corporation, Shenzhen (CN)

(72) Inventor: Yi Cai, Jackson, NJ (US)

(73) Assignee: ZTE Corporation, Shenzhen (CN)

(*) Notice: Subject to any disclaimer, the term of this patent is extended or adjusted under 35 U.S.C. 154(b) by 0 days.

(21) Appl. No.: 15/136,711

(22) Filed: Apr. 22, 2016

(65) Prior Publication Data

US 2016/0315637 A1 Oct. 27, 2016

Related U.S. Application Data

(60) Provisional application No. 62/152,790, filed on Apr. 24, 2015.

(51) Int. Cl.
| | |
|---|---|
| H03M 13/00 | (2006.01) |
| H03M 13/29 | (2006.01) |
| H04B 10/516 | (2013.01) |
| H04B 10/54 | (2013.01) |
| H04L 1/00 | (2006.01) |
| H03M 13/25 | (2006.01) |

(52) U.S. Cl.
CPC ..... *H03M 13/2918* (2013.01); *H03M 13/251* (2013.01); *H03M 13/2945* (2013.01); *H03M 13/2963* (2013.01); *H03M 13/2966* (2013.01); *H04B 10/516* (2013.01); *H04B 10/541* (2013.01); *H04L 1/00* (2013.01); *H03M 13/258* (2013.01)

(58) Field of Classification Search
CPC ......... H03M 13/2918; H03M 13/2945; H03M 13/251; H03M 13/2963; H03M 13/2966; H03M 13/258; H04B 10/516; H04B 10/541

See application file for complete search history.

(56) References Cited

U.S. PATENT DOCUMENTS

2009/0282314 A1* 11/2009 Djordjevic .......... H03M 13/296
714/755

OTHER PUBLICATIONS

Bosco, G., et al., "On the Performance of Nyquist-WDM Terabit Superchannels Based on PM-BPSK, PM-QPSK, PM-8QAM or PM-16QAM Subcarriers," Journal of Lightwave Technology, 29(1):53-61, Jan. 2011.
Cai, J.X., et al., "Transmission over 9,100 km with a Capacity of 49.3 Tb/s Using Variable Spectral Efficiency 16 QAM Based Coded Modulation," Optical Fiber Communication Conference: Postdeadline Papers, (Optical Society of America, 2014), San Francisco, California, U.S.A., Paper Th5B.4, pp. 1-3, Mar. 2014.
Cai, Y., "On Forward Error Correction Codes and Line-coding Schemes in Optical Fiber Communications," Dissertation submitted to the Faculty of the Graduate School of the University of Maryland in partial fulfillment of the requirements for the degree of Doctor of Philosophy, pp. 1-153, 2001.

(Continued)

*Primary Examiner* — Sam Rizk
(74) *Attorney, Agent, or Firm* — Perkins Coie LLP

(57) ABSTRACT

An optical transmission technique includes receiving data for transmission over the optical communication network, applying a three-dimensional (3D) error correction code to the data using three component codes, resulting in error correction coded signal, modulating the error correction coded signal using a quadrature amplitude modulation (QAM) scheme and processing and transmitting the modulated signal over the optical communication medium.

20 Claims, 15 Drawing Sheets

(56) References Cited

OTHER PUBLICATIONS

Cai, Y., et al., "On Turbo Code Decoder Performance in Optical-Fiber Communication Systems With Dominating ASE Noise," Journal of Lightwave Technology, 21(3):727-734, Mar. 2003.

Djordjevic, I.B., et al., "Mitigation of Linear and Nonlinear Impairments in High-Speed Optical Networks by using LDPC-Coded Turbo Equalization," IEEE Journal on Selected Areas in Communications, 26(6):73-83, Aug. 2008.

Jia, Z., et al., "Experimental demonstration of iterative post-equalization algorithm for 37.5-Gbaud PM-16QAM quad-carrier Terabit superchannel," Optics Express, 23(3):2157-2162, Feb. 2015.

Lau, P., et al., "Signal Design and Detection in Presence of Nonlinear Phase Noise," Journal of Lightwave Technology, 25(10):3008-3016, Oct. 2007.

Millar, D.S., et al., "Experimental Demonstration of 24-Dimensional Extended Golay Coded Modulation with LDPC," Optical Fiber Communication Conference, OSA Technical Digest (online) (Optical Society of America, 2014), San Francisco, California, U.S.A., Paper M3A.5, pp. 1-3, Mar. 2014.

Randel, S., et al., "Advanced Modulation Schemes for Short-Range Optical Communications," IEEE Journal of Selected Topics in Quantum Electronics, 16(5):1280-1289, Sep./Oct. 2010.

Sjödin, M., et al., "Comparison of 128-SP-QAM with PM-16-QAM," Optics Express, 20(8):8356-8366, Apr. 2012.

\* cited by examiner

TURBO PRODUCT CODED MODULATION

CROSS REFERENCE TO RELATED APPLICATION

This patent document claims the benefit of priority of U.S. Provisional Patent Application No. 62/152,790, filed on Apr. 24, 2015. The entire content of the before-mentioned patent application is incorporated by reference as part of the disclosure of this application.

BACKGROUND

This patent document relates to digital communication, and, in one aspect, optical communication systems.

There is an ever-growing demand for data communication in application areas such as wireless communication, fiber optic communication and so on. The demand on core networks is especially higher because not only are user devices such as smartphones and computers using more and more bandwidth due to multimedia applications, but also the total number of devices for which data is carried over core networks is increasing. For profitability and to meet increasing demand, equipment manufacturers and network operators are continually looking for ways in which transmission bandwidth can be increased while operational and capital expenditure can be reduced.

SUMMARY

The present document discloses, among other things, techniques for encoding and decoding signals using three-dimensional turbo product coded error correction codes.

In one example aspect an optical transmission technique includes receiving data for transmission over the optical communication network, applying a three-dimensional (3D) error correction code to the data using three component codes, resulting in error correction coded signal, modulating the error correction coded signal using a quadrature amplitude modulation (QAM) scheme and processing and transmitting the modulated signal over the optical communication medium.

In another example aspect, a technique for receiving optical signals includes receiving, from the optical communication network, an optical signal comprising quadrature amplitude modulated data in which the data is error correction coded using a three-dimensional error correction code having three component codes, performing front end processing on the optical signal to generate digitized samples of the optical signal, performing error correction decoding on the digitized samples, and recovering data from the error correction decoded digitizing samples.

These and other aspects, and their implementations and variations are set forth in the drawings, the description and the claims.

DETAILED DESCRIPTION

Figure 1:
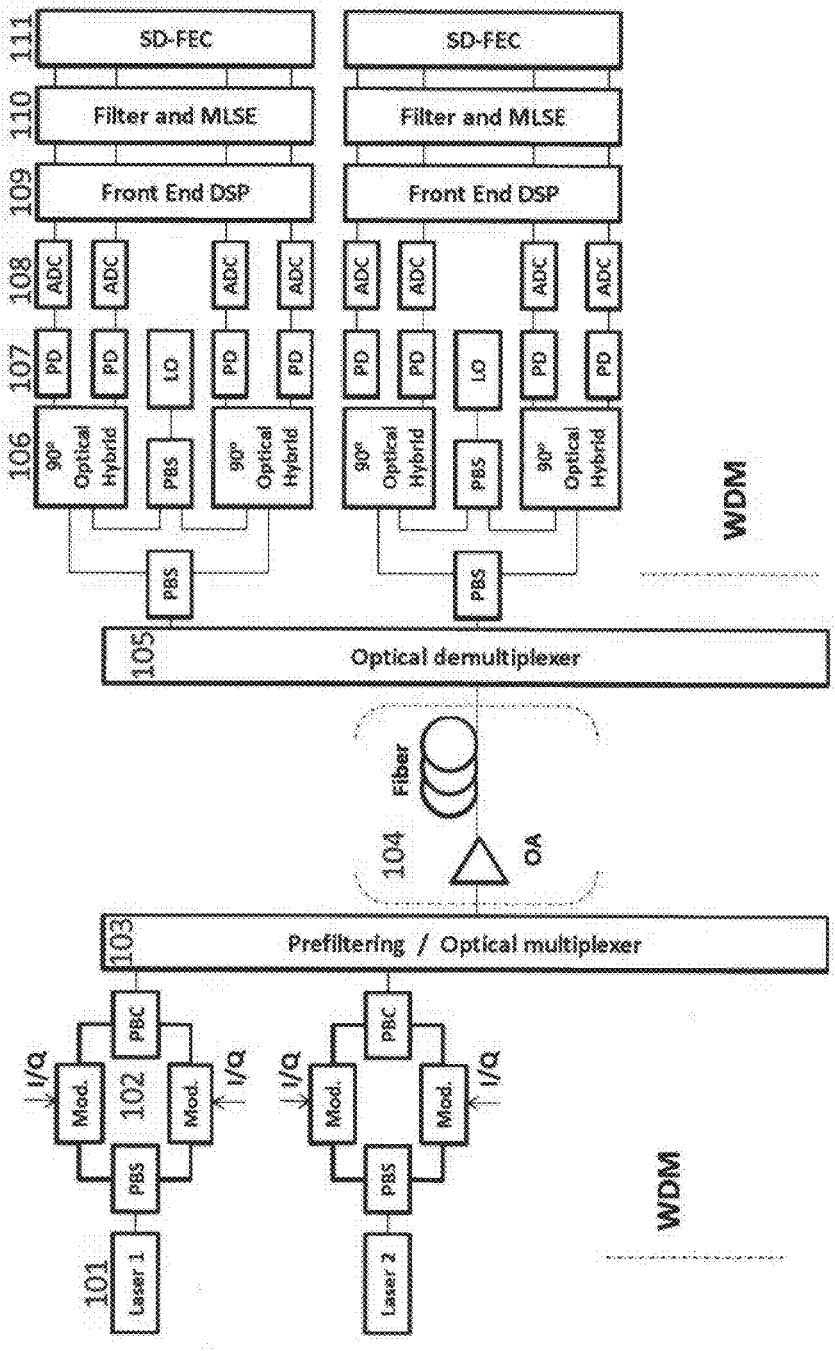
FIG. 1 shows an example of a digital communication system.

To meet the increasing demand on high data communication bandwidth, developers are continuously looking for new ways by which to carry a greater number of data bits over existing communication infrastructure. In optical communication, data is transmitted over optical carriers, e.g., glass or plastic optical fibers by modulating using a variety of different techniques. Some techniques implement data modulation in the electrical domain, e.g., by processing electronic signals. Alternatively or in addition, data modulation can also be achieved in the optical domain, e.g., using photonic signal processing.

High spectral efficiency (SE) modulation and high performance coding are playing ever more important roles in recent progress of optical fiber transmissions. Modulation with multi-level signal helps to increase SE with a price of higher required signal to noise ratio (SNR), whereas coding trades bandwidth for lower required SNR. Coded modulation technology was developed to integrate modulation and coding and provide an effective way to tradeoff SE and transmission performance. One technique for boosting the performance of a coded modulation scheme is to generate accurate soft information in the combined demodulation and decoding process.

In the various embodiments described in the present document, depending on the transmitter-side or the receiver-side signal processing, some of the following features may be incorporated.

At the transmitter-side in the optical fiber transmission system, a turbo-product coded modulation scheme (TPCM) may be used. When data is received by a transmitter from the transmission device for transmission over the medium, a 2-dimensional (2D) TPC encoder start to encode the data. Then, a 3rd dimension of encoding is applied, which may be a binary coding on modulation symbols rather than binary bits along the $3^{rd}$ orthogonal dimension or the diagonal dimension of the 2D TPC. One advantage of such a modulation-symbol based coding is allowing a higher code rate than using bit-based coding and, thus, saving bandwidth resource for coded high-order modulation systems.

In some embodiments, a method of construction of the third dimensional encoder with high code rate may be as follows. When output data of 2D TPC encoder is received, the encode bits can be divided to k symbols with size of modulation order (m) and n-k partial symbols with size of modulation order minus one (m−1). The application of binary coding on the k-symbols and n-k partial symbols can be performed in three steps: step 1, k bits are generated based on parity checking of the k symbols; step 2, the k bits generated in step 1 are encoded into n bits employing a (n, k) binary code such as SPC, Hamming, or BCH code, which generate n-k parity bits according to the (n, k) binary coding rule; step 3, each of the n-k parity bits generated in step 2 is assigned to one of the n-k partial symbols as a parity checking target, one bit is added to each of the n-k partial symbols according to the parity checking target. Thus the input k symbols and n-k partial symbols are encoded into n symbols based on the (n, k) binary code. The n m-bit symbols may be modulated with Gray mapping or other mapping method, process the modulated signal for transmission (e.g., digital to analog conversion and frequency upconversion), and transmitted over a transmission medium.

At the receiver-side in the optical fiber transmission system, a TPCM receiver-side scheme may be as follows. When received optical signal comprising error correction coded data is received, front end processing may be performed to generate soft decision. The receiver can perform error correction decoding using a 3D error correction decoder. The error correction decoder can be an iterative 3D TPC decoder with ordinal decoding through every dimension. The error correction decoder also can be denoted as a high code rate inner decoder and a 2D TPC outer decoder. The outer decoder can be decoded as iterative TPC decoding algorithm and the inner decoder can be decoded by maximum a posteriori (MAP) decoder that can be look-up table (LUT) or Bahl-Cocke-Jelinek-Raviv (BCJR) algorithm. The decoding strategy may match the corresponding method of encoder.

These, and other features, are described in greater detail herein.

Figure 7:
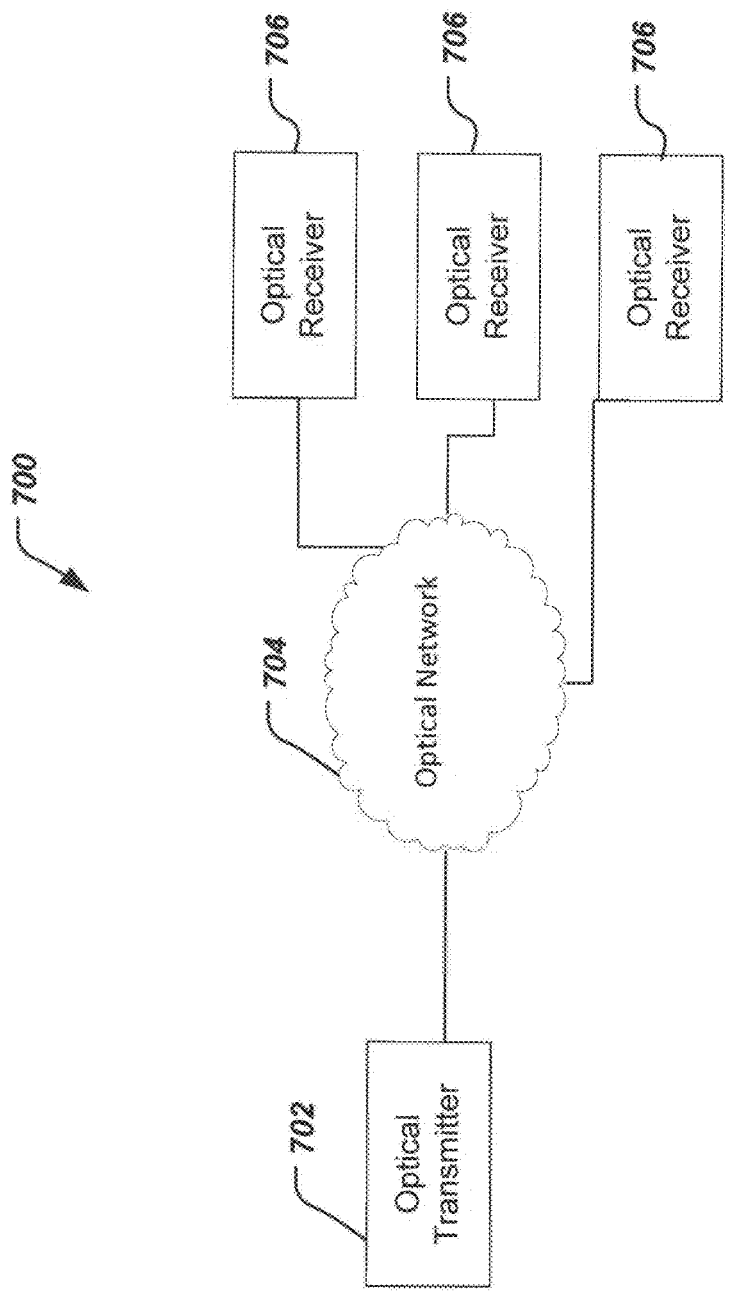
FIG. 7 shows an example optical communication system.

FIG. 7 depicts an optical communication system 700 in which the presently disclosed technology can be embodied. One or more optical transmitters 702 are communicatively coupled via an optical network 704 with one or more optical receivers 706. The optical network 704 may comprise optical fibers that extend in length from several hundred feet (e.g., last mile drop) to several thousands of kilometers (long haul networks). The transmitted optical signals may go through intermediate optical equipment such as amplifiers, repeaters, switch, etc., which are not shown in FIG. 7 for clarity. The transmitter-side techniques disclosed in the present document may be implemented by transmission circuitry of 702, 706. The receiver-side techniques described herein may be implemented by receiver circuitry of 702, 706.

In one aspect, a method for receiving and detecting optical signal employing a turbo product coded modulation format is disclosed herein. In some embodiments, the method can be implemented in a coherent optical receiver using soft-information based demodulation and decoding. One advantage of the described technique is to improve the performance of modulation formats with multilevel signals, i.e., having more than two signal points in each signal dimension, such as PAM (pulse amplitude modulation), PSK (phase shift keying), QAM (quadrature amplitude modulation), etc., by integrated iterative demodulation and decoding. The disclosed scheme provides a multi-dimensional product coding structure and method of soft-information generation in the iterative decoding process. Another advantage of the disclosed scheme is that the margin of optical signal to noise ratio (ROSNR) for spectral efficient multi-dimension and multi-level modulation formats advantageously increases.

The present document discloses, among other things, a 3-dimensional turbo-product-coded modulation scheme with performance exceeding the claimed theoretical limit on state-of-the-art SPC-LDPC scheme. The inventor's experiments have shown that transmission performance of 2460 km 4.8 bits/s/Hz transmission of a turbo-product-coded 40 Gbaud 16-QAM modulation can be achieved. These, and other, aspects are described in detail herein.

Introduction

In recent progress of optical fiber transmission technology, two parallel technology tracks, forward error correction coding and advanced modulation format, were merged in coded modulation schemes. A coded modulation scheme employing single parity check (SPC) and low density parity check (LDPC) codes has been demonstrated in record transmission experiments, and the SPC-LDPC scheme was claimed reaching a 0.15 dB range of its theoretical limit. To further approach the ultimate channel capacity, the present document discloses a turbo product coded modulation (TPCM) scheme. The TPCM performance, with the same amount of overhead, can exceed not only the SPC-LDPC scheme but also its claimed theoretical limit.

The basic WDM (wavelength division multiplexing) transmission system with coherent detection is shown in FIG. 1 as the exemplary embodiment. The lightwave generated laser (101) is split by a polarization beam splitter (PBS) and individually modulated by I/Q modulators (or other type of modulators generating QAM signal), and then combined with a polarization beam combiner (PBC) to realize polarization multiplexed QAM modulation (102). This NRZ-QAM modulation can be realized by cascaded serial or parallel modulators. To obtain Nyquist (symbol-rate channel bandwidth) or faster-than Nyquist WDM signals (less than symbol-rate channel bandwidth), narrow-band filtering and spectrum shaping can be applied on the modulator driving signals (I/Q) with electrical filters and/or the optical multiplexer (103) output signal with narrow-band optical filters. The transmission link (104) consists of optical amplifiers (OA) and optical fiber spans. After transmission, an optical demultiplexer (105) is used to demultiplex the WDM channels to coherent detectors. At the receiver side, a LO signal after PBS is launched into a 90° optical hybrid (106) for coupling with polarization split received signals. The polarization and phase diversified signals are detected with photodiodes (PD) (107) and then digitally sampled in analog-to-digital converters (ADC) (108). Several front-end DSP (digital signal processor) modules (109) may be employed to compensate the optical front end (106 and 107) distortions. For example, one (or more) DSP module per polarization plane may be used. Subsequently, the signal is processed for equalizations of static and dynamic linear impairments with an adaptive digital filter, timing and carrier recovery, high frequency noise suppression, sequence detection, and error correction.

Figure 2:
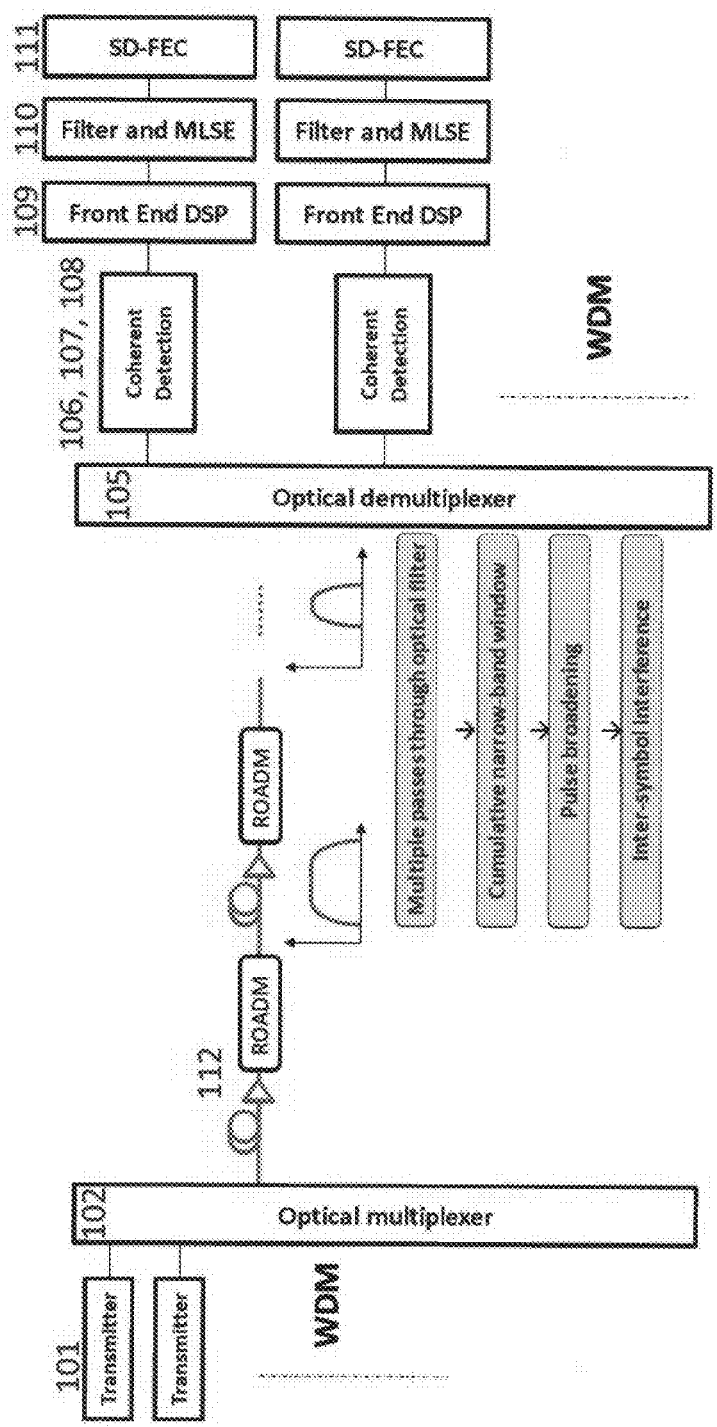
FIG. 2 shows an example transmission system in which multiple reconfigurable optical add-drop multiplexers (ROADMs) are present.

FIG. 2 shows an example block diagram in which multiple transmitters 101 are wave division multiplexed by a multiplexer 102 and the WDM signal is transmitted over a fiber optic network through multiple ROADMs. One result of such multi-stage processing of optical signals is that the original signal experiences multiple filtering stages, which cumulatively may result in a narrowband window (filter), causing the pulse to broaden in time domain and thus resulting in time division intersymbol interference (ISI).

Further, on the receiver side, the received signal is processed through an optical demultiplexer 105 that demultiplexes the WDM signals, and each demultiplexed signal component may be subject to coherent detection, from end DSP, channel estimation filtering and maximum likelihood sequence estimation (106, 107, 108, 109, 110). The resulting signal may be error correction coded using soft decision forward error correction (111).

Figure 3:
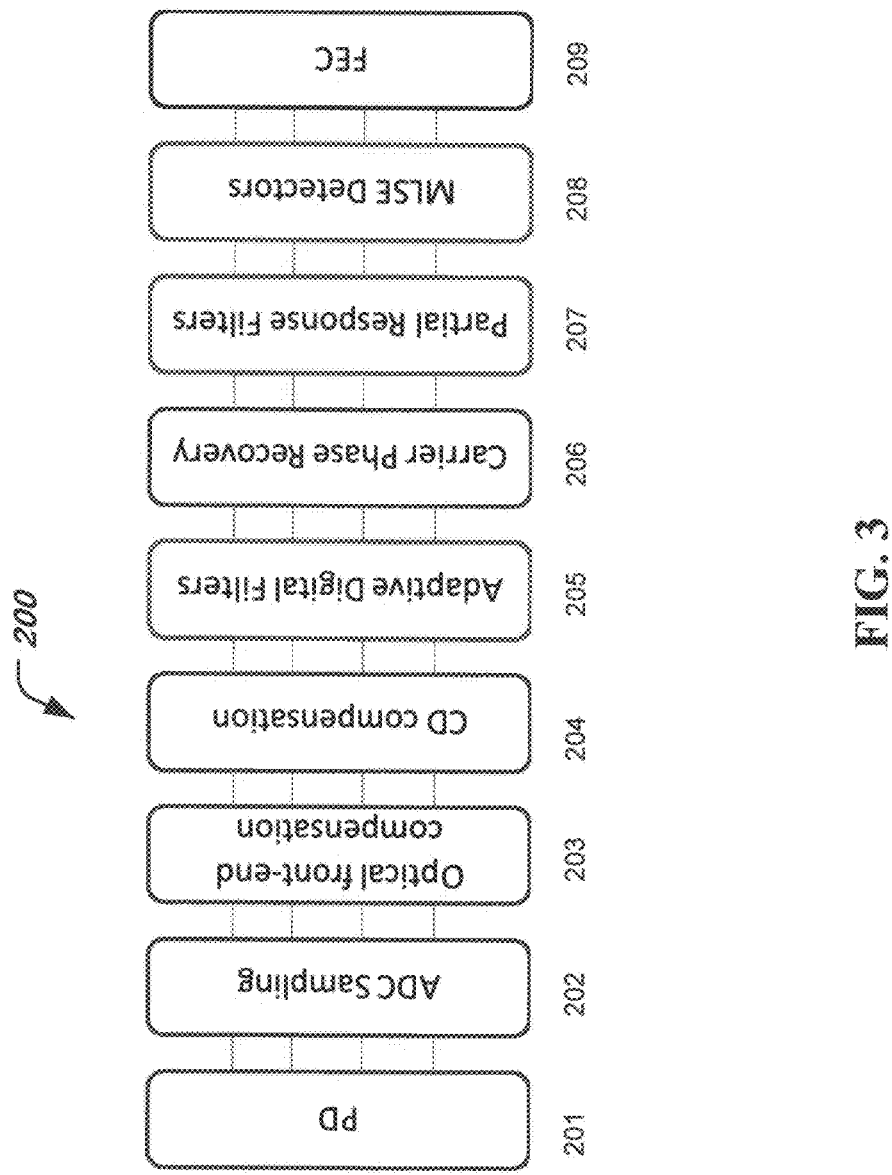
FIG. 3 shows an example embodiment of signal processing for receiving an optical modulated signal and recovering data bits.

FIG. 3 shows yet another embodiment of a receiver 200 in which a received optical signal is converted from optical domain to an electrical domain signal using a photodiode (PD) 201, then converted into digital samples using an analog to digital conversion (ADC) circuit 202. The digital samples are processed to compensate for non-linearity of the front end 203, errors due to chromatic dispersion 204. The resulting CD compensated signal is filtered through adaptive digital filters (205) to perform channel compensation, carrier phase recovery (206). The output signal may be processed through partial response filters (207) and MLSE detectors (208) and the resulting signal may be processed through a forward error correction module (209).

Two aspects in the performance of coded modulation schemes, are often analyzed for comparison: the waterfall region (where performance rapidly degrades) and error flare level (the floor below which it is hard to improve performance). For the majority of recently reported work, the focus is on waterfall performance leaving error flare evaluation a missing piece, and a line Q-threshold is usually obtained by extrapolating the waterfall curve while assuming no error flare occurrence. Results of TPCM embodiments with respect to both these embodiments are disclosed herein. The disclosed techniques demonstrate superior waterfall performance with simulations and experiments. For error flare evaluation, which is practically beyond the reach of numerical and experimental evaluations without a full speed implementation of the TPCM, a union bound method to perform theoretical analysis has been used.

In some disclosed embodiments, for 400 Gb/s 16 QAM long-haul transmissions, a 3-dimensional (3D) TPCM with a 60% overhead can be used. Waterfall region simulation and back-to-back (BTB) measurement of such embodiments show that the TPCM scheme outperforms the prior record-setting SPC-LDPC scheme and its theoretical limit by 0.6 dB and 0.45 dB, respectively. Transmission experiments were carried out over 2460 km EDFA-only (erbium doped fiber amplifier) SSMF (standard single mode fiber) link at 40 Gbaud achieving 4.8 bits/s/Hz net spectral efficiency (SE). All TPCM channels were decoded error free for Q-factors ranged from 2.7 to 3.1 dB.

A subsequent union-bound evaluation, however, shows at a $10^{-15}$ decoded bit error rate (BER) the TPCM scheme encounters an error flare at a Q-factor of 4.5 dB, referred to as an error flare threshold hereafter, which is higher than the Q-threshold obtained from waterfall extrapolation. It indicates the importance of reliable error flare evaluation when pushing the waterfall performance to very low Q-factors. The indication also applies to the SPC-LDPC schemes, because LDPC tends to have even higher error flare than does turbo product code (TPC). The present document also demonstrates that the union bound method can effectively facilitate error flare control in constructing TPCM schemes, a significant advantage brought by the algebraic coding properties of the TPCM.

Examples Turbo Product Coded Modulation Schemes

TPCM extends TPC to high SE modulations, in which the key is to effectively combine the reliability information from demodulation and decoding. In some conventional techniques, a 2-dimensional TPC is associated with QAM modulations. By contrast, the techniques disclosed herein extend TPCM to 3D to meet the high performance requirement in optical fiber transmissions. Distinguished from the SPC-LDPC scheme that has separate inner LDPC and outer SPC iterations, TPCM integrates the whole process into a monogenic coding structure.

Figure 8:
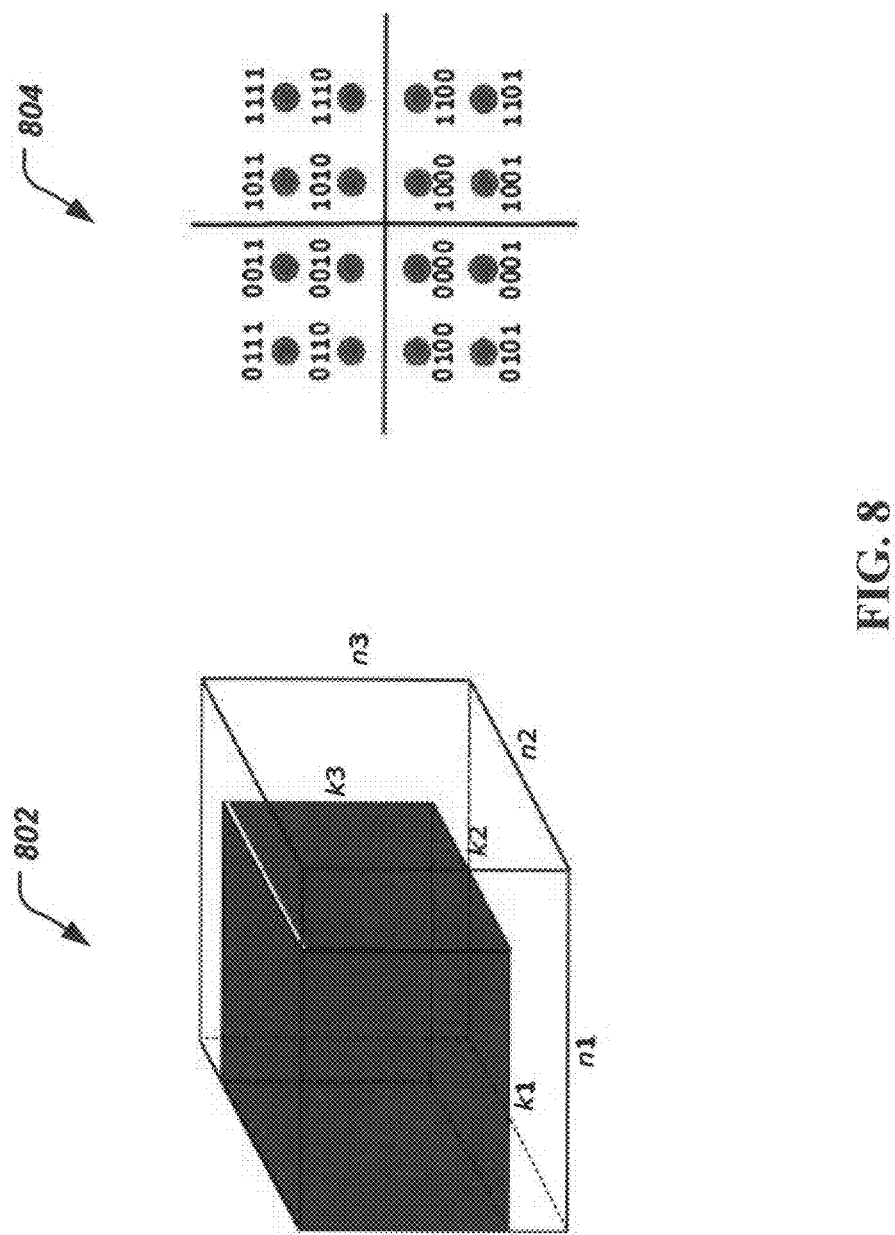
FIG. 8 depicts the code structure and bit mapping scheme for a 3D TPC 16-QAM modulation.

FIG. 8 depicts the code structure and bit mapping scheme for a 3D TPC 16-QAM modulation. As shown in graph 802, the 3D TPC comprises 3 component codes interleaved in a rectangular prism, where ni, ki (i=1, 2, 3). The three codes represent, respectively, the codeword and information length in the i-th dimension (i=1, 2, 3). To facilitate code construction and analysis, it is preferred to use linear code such as SPC (single parity check), Hamming code, and BCH code as the component codes. For both waterfall and error-flare performance, it is useful to implement large minimum Euclidean distance among signal points. The minimum distance (dmin) of a TPC equals the product of minimum distances of its component codes. For example, a SPC×Hamming×Hamming code has a dmin=2×3×3=18.

The example bit mapping 804 makes all neighboring symbols having only one bit in difference and so parity coding is naturally associated with modulation partitioning, however other bit mappings can be used also. At the initial decoding stage, soft decisions of received symbols can be made using the constellation map. The soft decisions are then fed into an iterative TPC decoder and the decoding iterates through all dimensions. A full iteration is completed after each and every dimension completes one decoding cycle. In principle, a product of gradual and even decoding strength from all dimensions is more efficient and effective than does an overwhelming strength in one dimension. The Chase algorithm can be employed to approach maximum likelihood decoding with significantly reduced complexity. Using such an algorithm, the number of trials to achieve at optimum results grows linearly with Hamming distance.

In the scheme shown in FIG. 8, however, all error correction processes are bit based. The physical transmission and physical impairments corresponding to high order modulations such as 16 QAM, on the other hand, are symbol based, and different bits in one symbol may not be identical in the sense of noise and impairment effects. Hence, we propose a symbol based coding scheme as depicted in FIG. 13, which can at least in one of the coding dimensions detect and correct symbol errors without distinction of different bits in each high order modulation symbol, yet the scheme still utilizes binary error correction codes.

Figure 13:
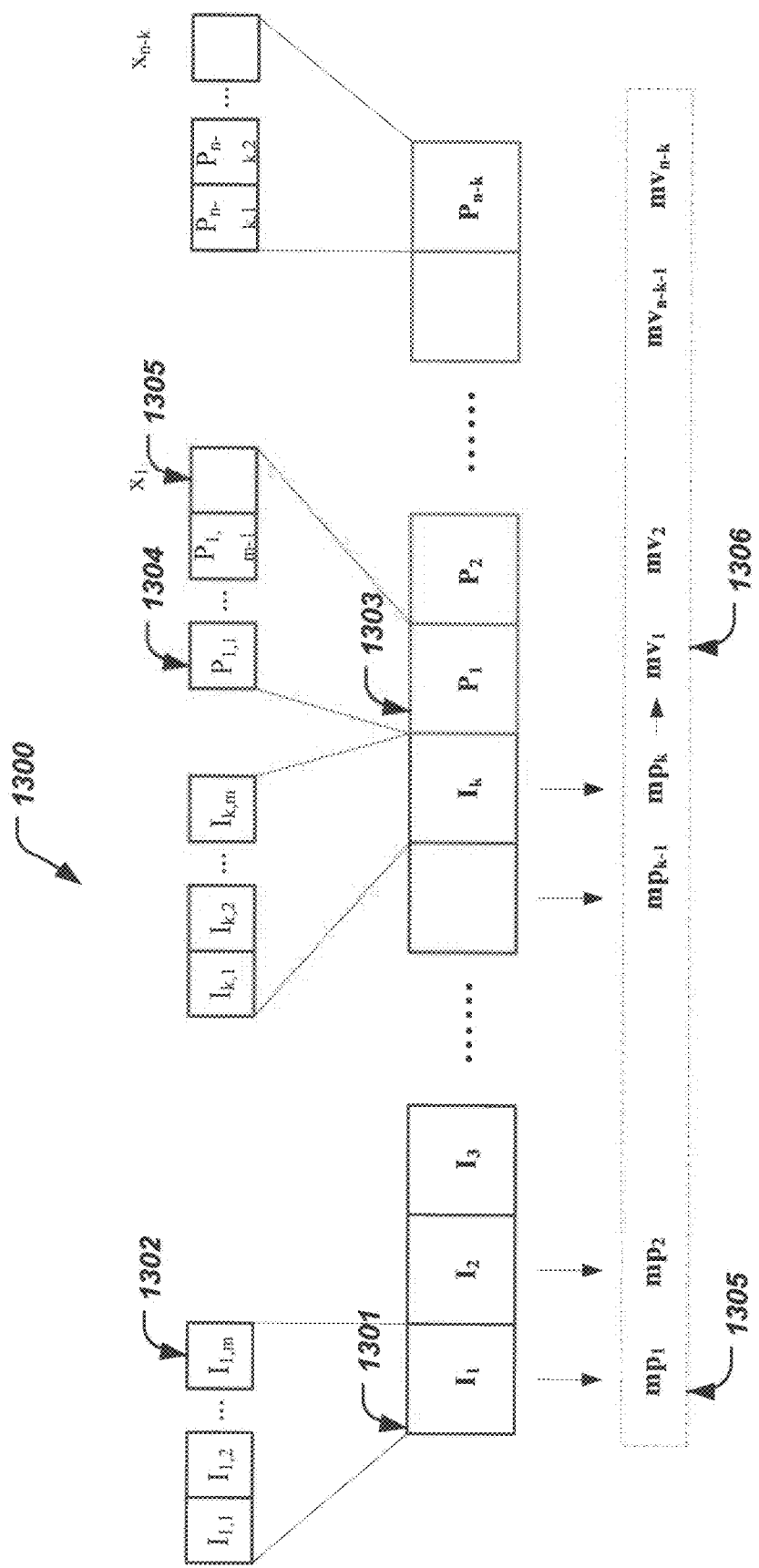
FIG. 13 shows an example of a high bitrate code using binary code and multi-bit symbol parity check.

In order to apply binary coding to high-order modulation symbols, as shown in FIG. 13 as an example, for the output bit sequence D of a prior TPC encoder, one can divide the bit sequence D into k symbols $I_1, I_2, \ldots, I_k$ (1301) each contains m bits, such as $I_{1,1}, I_{1,2}, \ldots, I_{1,m}$ (1302) and n-k incomplete symbols $P_1, P_2, \ldots, P_{n-k}$ (1303) each having m−1 bits such as $P_{1,1}, P_{1,2}, \ldots, P_{1,m-1}$ (1304) assigned from D and an empty bit slot such as $P_{1,m}$ to be filled, where m is the binary logarithm of modulation constellation size. The application of binary coding on the k-symbols and n-k incomplete symbols can be performed in three steps to fill the empty bit sots, $P_{1,m}, P_{2,m}, \ldots, P_{n-k,m}$.

Step 1: For each of the k symbols (1301) containing m bits (1302), one bit is generated based on parity checking of the m bits in the symbol. Thus, the k symbols can be represented by k bits $mp_1, mp_2, \ldots, mp_k$.

Step 2: The k bits generated in step 1 are encoded into n bits employing a (n, k) binary code such as SPC, Hamming, or BCH code, which generate n-k parity bits, namely $mv_1$, $mv_2, \ldots, mv_{n-k}$, according to the (n, k) binary coding rule (1306).

Step 3: Each of the n-k parity bits generated in step 2, $mv_1, mv_2, \ldots, mv_{n-k}$, is assigned as a parity checking target to one of the n-k incomplete symbols such as $P_{1,1}$, $P_{1,2}, \ldots, P_{1,m-1}$ (1304). Then for each of the incomplete symbol, such as $P_1$, a parity check bit, such as $x_1$ (1305), is calculated and filled in the empty bit slot, such as $P_{1,m}$, to make the symbol complete, Thus, all the m bits $P_{i,1}$, $P_{i,2}, \ldots, P_{i,m-1}$ in a complete symbol $P_i$ would meet the parity checking target $mv_i$ assigned to the symbol.

For example, one can use a (15, 11) Hamming code to encode a 56-bit input data segment to a 60-bit encoded codeword. Assuming a 16 QAM modulation, one can divide the 56 binary bits to 11 complete 4-bit symbols (1301) and 4 incomplete symbols (1303) each with 3 bits filled and 1 empty bit slot. Then, one can compute the parity check bit of every complete 4-bit symbol. And then, one can use a (15, 11) Hamming code to encode these parity check bits and get four parity bits, $mv_1$, $mv_2$, $mv_3$ and $mv_4$ setting parity checking targets for the 4 incomplete symbols. Assuming an even parity checking rule, one can calculate and fill the empty slots (1304) by $P_{i,4}=x_i=P_{i,1} \oplus P_{i,2} \oplus P_{i,3} \oplus mv_i$, i=1, 2, 3, 4. In this case, with the proposed coding scheme one gets a code rate of 56/60 utilizing a Hamming code with a code rate of 11/15.

Figure 14:
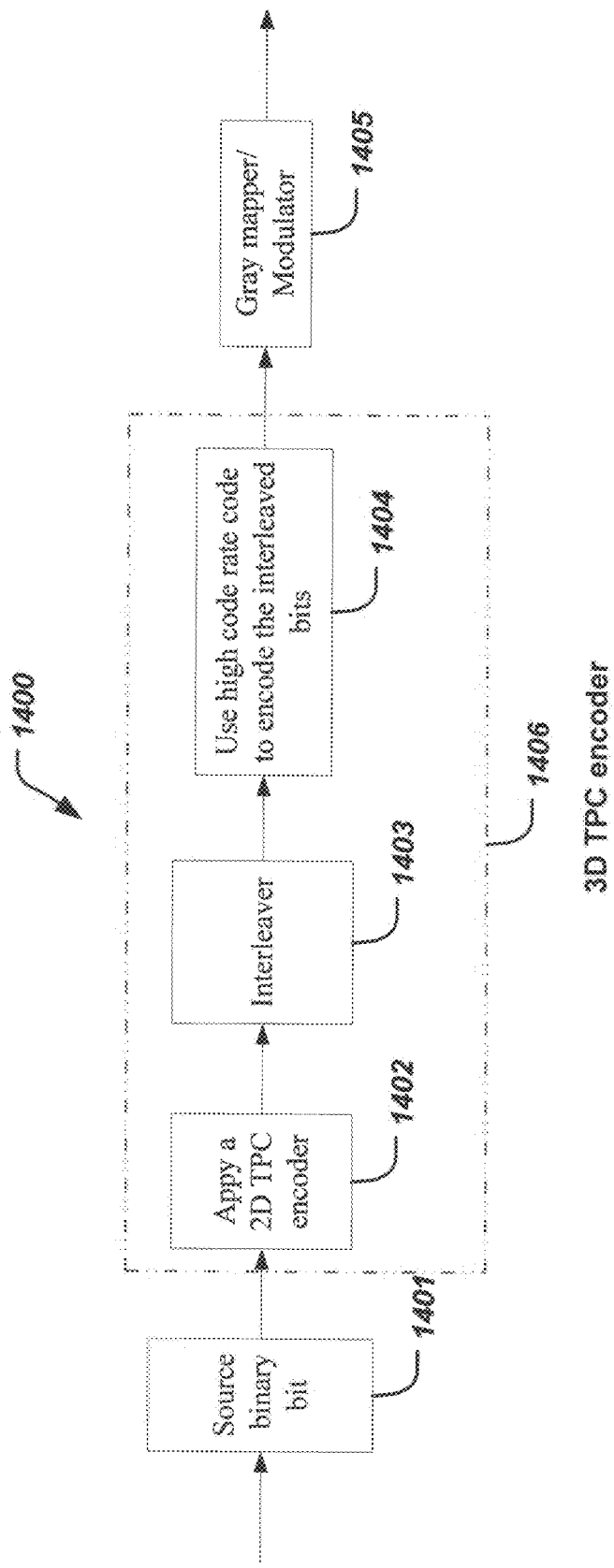
FIG. 14 shows an example flowchart of an error correction encoding process.

FIG. 14 depicts the flow chart of a TPCM encoder of the invention (1400). The source binary bits (1401) can be encoded with a 2D TPC encoder (1402), and followed by an interleaver (1403) which can be orthogonal dimension extension or other specified method. Then the 3rd dimension encoding can be applied with the proposed high code rate code (1300) to encode the interleaved bits (1404), for example as described with respect to FIG. 13. Finally, Gray mapping and modulation (1405) can be applied to the output of 1404. The modules 1402, 1403 and 1404 collectively could be referred to as a 3D TPC encoder (1406).

Figure 15:
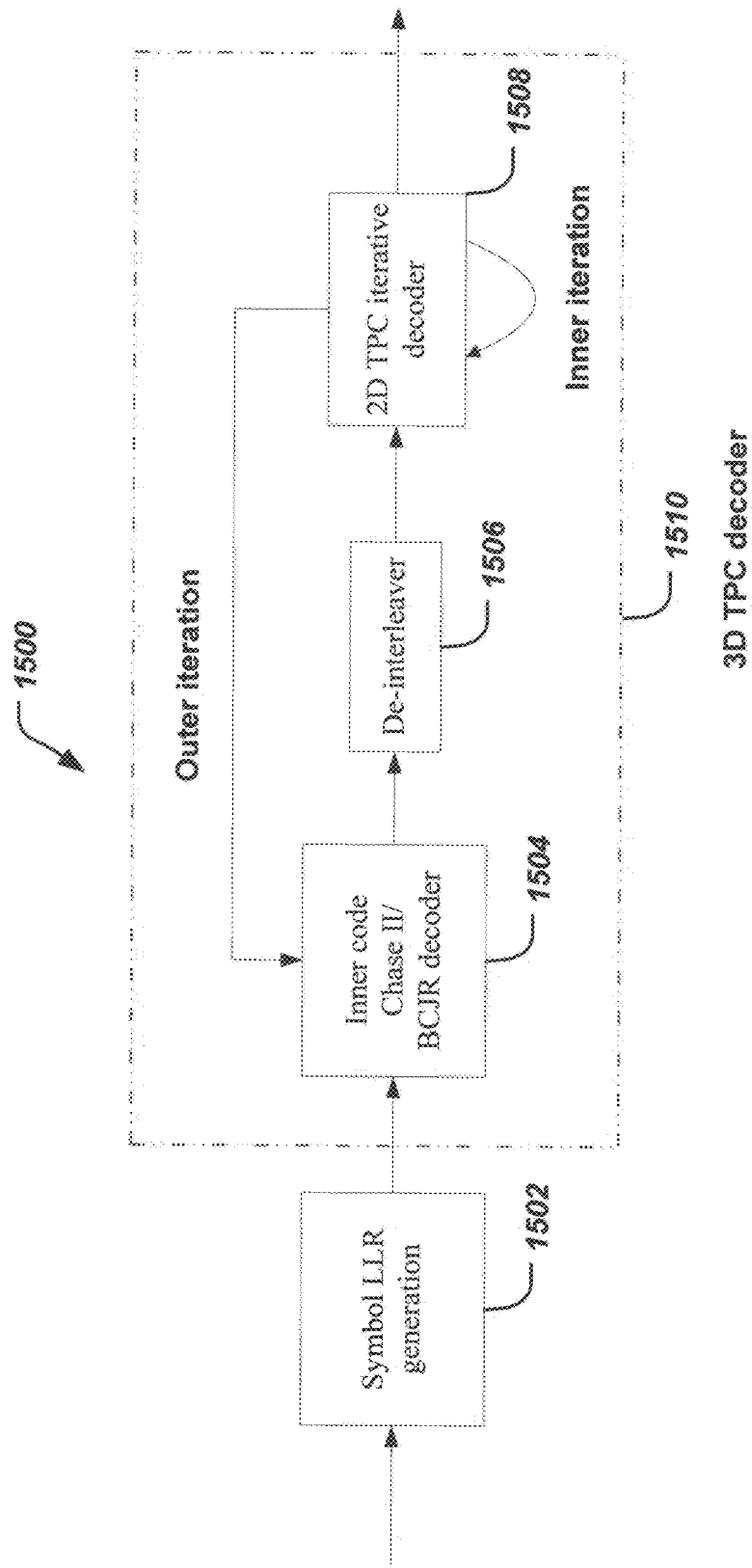
FIG. 15 shows an example flowchart of an error correction decoding process.

FIG. 15 illustrates the flow chart of an exemplary TPCM decoder (1500). The received symbol sequence can be fed into the symbol log-likelihood ratio (LLR) generation modules (1502) which calculates symbol LLR as well as bit LLR. Following the LLR module, an inner decoder (1504) designed for the proposed binary coding on non-binary modulation symbols can carry out the initial decoding. Due to its nature of symbol-based process, the inner decoder is capable of symbol level error detection with a relatively low coding overhead. The symbol error detection results can be processed in the inner decoder with algorithms such as Chase II, BCJR, MAP, MLSE, or erasure decoding to update the symbol and bit LLRs for the subsequent process. A following de-interleaver (1506) carries out an inverse process of the encoding interleaver (1403), which can be simply row-column-layer transition or other specific transition corresponding to the interleaver function (1403). The output data sequence of the de-interleaver is fed into following decoders such as a 2D TPC decoder (1508). Iterative decoding can be implemented among the three consecutive decoders, i.e. the inner decoder and the two sub-decoders in the 2D TPC decoder. More complex nested iterative decoding may also be induced, where a local decoding iteration of the 2D TPC sub-decoders is nested within an outer iteration loop comprises the inner decoder. The modules 1504, 1506 and 1508 could collectively referred to as a 3D TPC decoder (1510). One can select appropriate number of iterations trading off performance and complexity.

Numerical and Experimental Demonstrations

A 3D 60% TPCM solution was developed for a 2-subcarrier 16QAM 400 Gb/s transmission system, which has a code length of 14336 bits and a dmin of 32.

Figure 9:
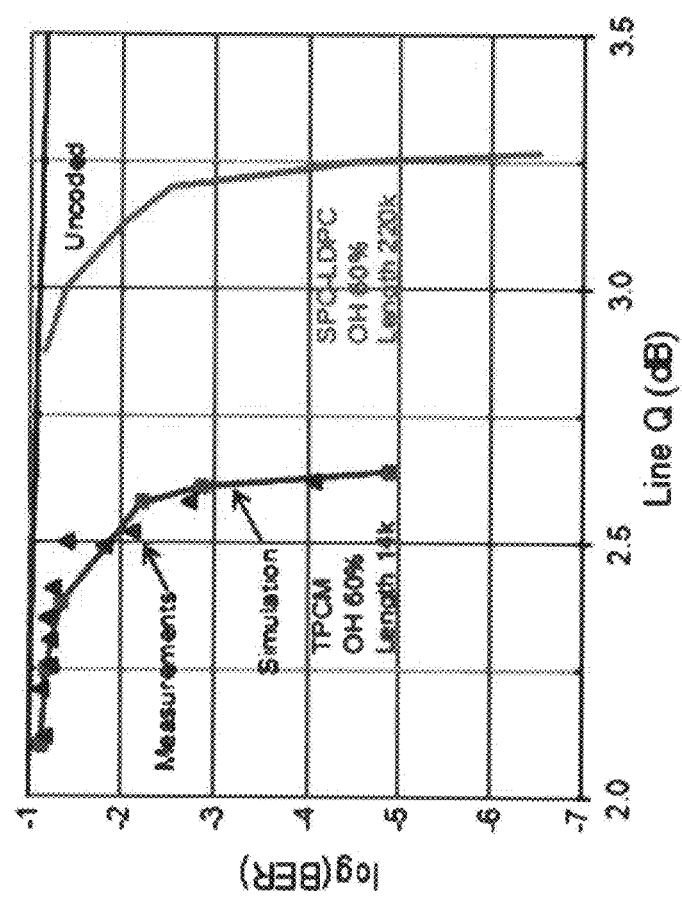
FIG. 9 shows an example of a performance graph for a back to backbit error rate simulation.

FIG. 9 depicts results of an example Monte Carlo simulation and BTB noise-loading measurement. For comparison, the prior record-setting SPC-LDPC performance is also plotted. The waterfall region of the TPCM is at a line Q of 2.65 dB, which outperforms the SPC-LDPC scheme by about 0.6 dB. Moreover, it was claimed in that the SPC-LDPC scheme is ~0.15 dB away from its theoretical limit, which implies that the TPCM performance exceeds the theoretical limit of the SPC-LDPC by about 0.45 dB.

Figure 10:
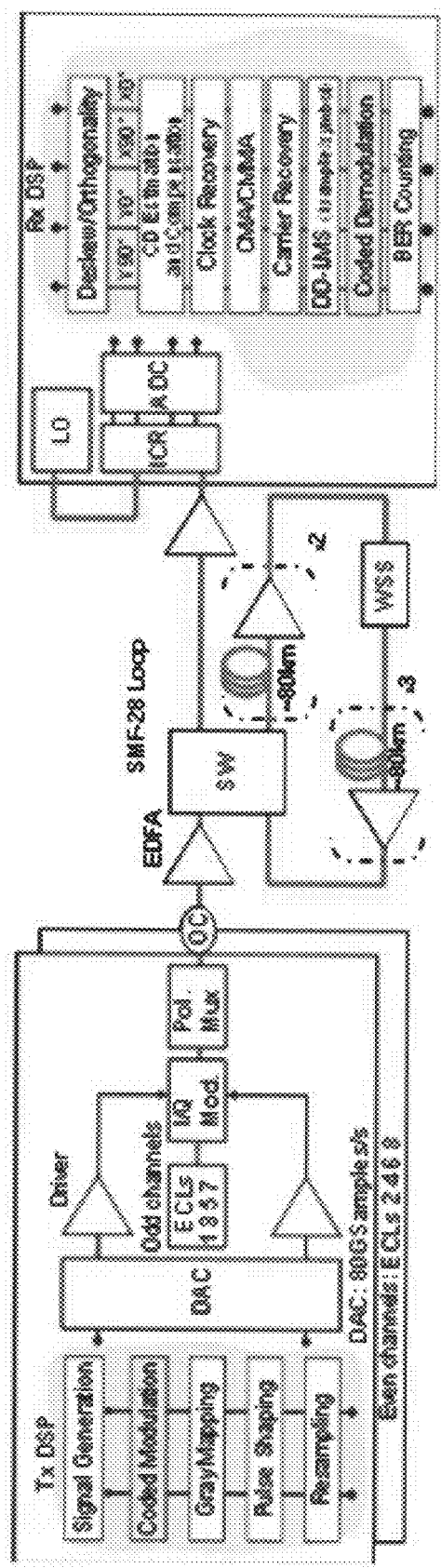
FIG. 10 shows an example experimental set up of an optical communication system.

Transmission of 4×2×200 Gb/s 42 GHz-spaced 16 QAM channels over 2460 km at 40 Gbaud and 4.8 b/s/Hz net SE was experimented on the setup shown in FIG. 10. Modulators are driven by a DAC operating at 80 Gsamples/s. The modulated signal is boosted and fed into the re-circulating loop made of total 410-km EDFA-only SSMF link with ~80 km per span.

Figure 11:
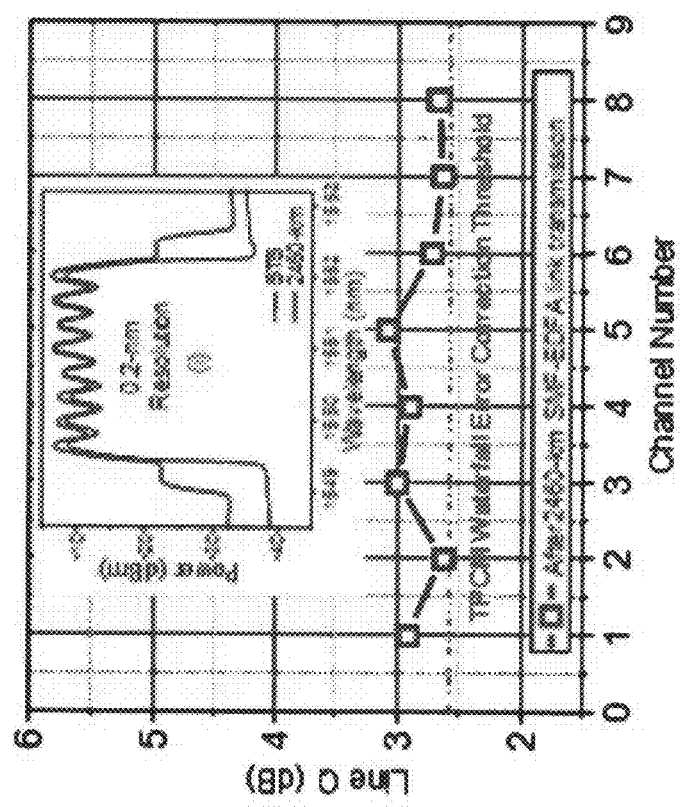
FIG. 11 shows an example of optical spectrum before and after transmission.

FIG. 11 depicts the optical spectra before and after transmission. At the receiver, the coherently detected signals are sampled at 160 Gsamples/second by a real-time digital oscilloscope with 65 GHz electrical bandwidth. The received samples are processed by offline DSP algorithm (only for simulations). The signals are then decoded by the TPCM decoder. As shown in FIG. 11, after 2460 km the WDM channels achieved 2.7 dB to 3.1 dB Q factors, and after 5 to 15 full TPCM iterations all channels were decoded error free.

TPCM Error Flare Control with Union Bound

For optical fiber transmission systems, due to the extremely low required bit-error-rate BER, error flare evaluation is beyond the reach of simulation and measurement tools without a full speed implementation. For the TPCM scheme, however, properties inherent in the linear-code-based structure make it advantageous in determination of weight enumerating function (WEF) and union-bound analysis. The weight distribution of decoded error patterns can be equivalently described with the WEF $A_d$. Thus, given the pairwise error probability $P_d$ for each possible weight d, the decoded word error probability $P_e$ is upper-bounded by the union bound as $$P_e \leq \sum_{d=d\,min}^{d\,max} A_d P_d. \qquad \text{Eq. (1).}$$

Figure 12:
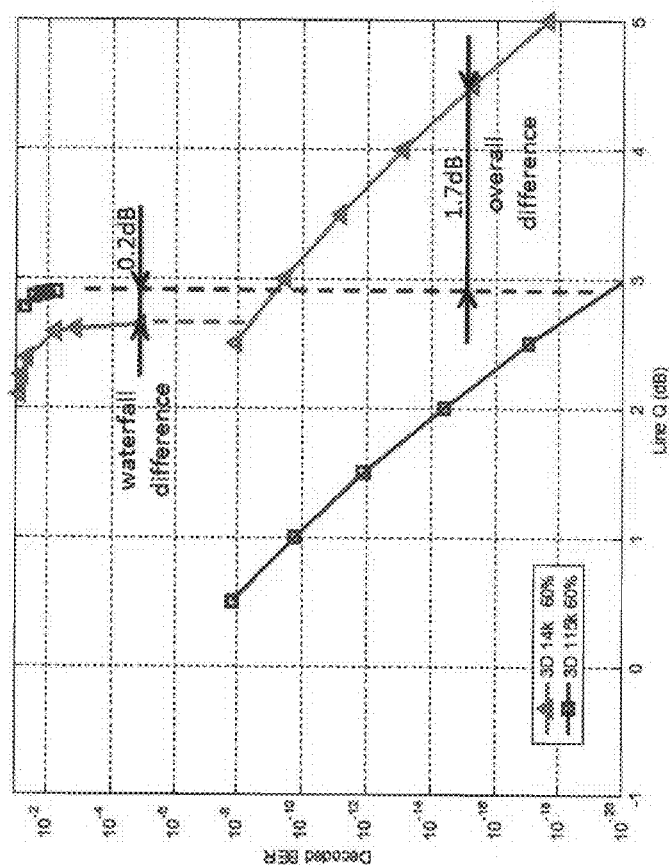
FIG. 12 shows an example graph depicting improvement that can be achieved using the presently disclosed techniques.

A union-bound based error flare estimation of the proposed 32-dmin TPCM scheme is plotted in FIG. 12. It shows an error-flare threshold of 4.5 dB, higher than the 2.65 dB waterfall Q threshold. Therefore, for performance assurance about 2 dB margin needs to be allocated against the waterfall Q threshold.

With the union bound analysis, it is straightforward to perform error flare control in TPCM design. As an example, the union bound of another 3D 60% TPCM scheme with a code length of 114 k bits and dmin=64 is evaluated and plotted in FIG. 12, which shows superior error flare performance. Also shown in FIG. 12, from the waterfall performance aspect the 64-dmin scheme is about 0.2 dB worse than the 32-dmin scheme. Nevertheless, taking into account both waterfall and error-flare performance, the 64-dmin scheme excels by 2 dB at $10^{-15}$ BER. It indicates that focusing only on better waterfall performance is not always an effective coding strategy. For the LDPC based schemes, on the other hand, WEF evaluation and theoretical error flare analysis are still missing pieces. LDPC prefers coding matrix with randomly distributed parity checks, which makes the determination of WEF a very challenging task. It has been recently reported that an LDPC was implemented with 30 FPGAs for its error flare evaluation. Compared to the time and resource consuming hardware verification, the readily obtainable error flare estimate of the TPCM shows a significant advantage.

Figure 4:
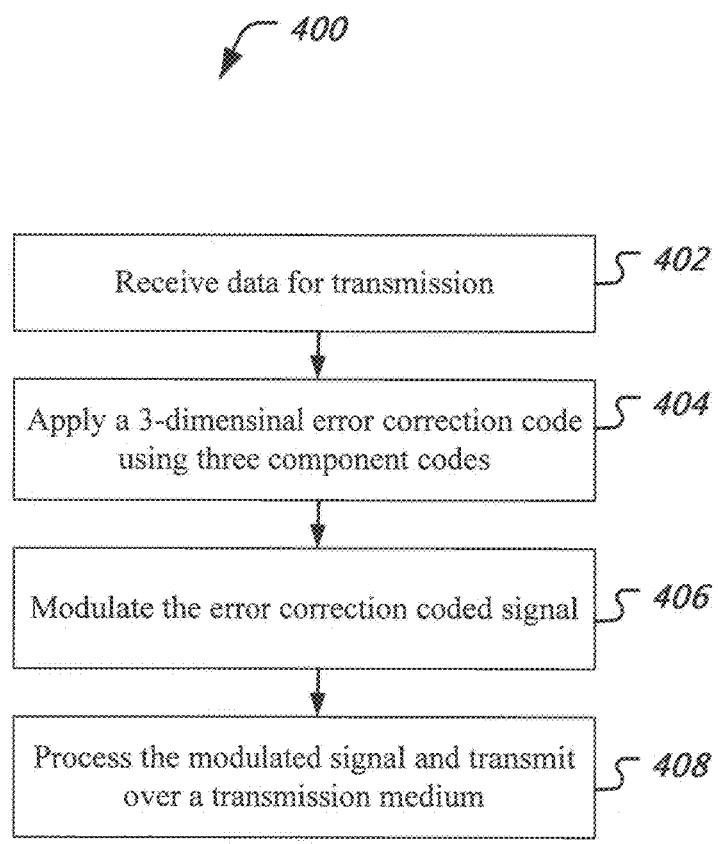
FIG. 4 shows an example optical signal transmission method.

FIG. 4 shows an example transmission method 400 that may be implemented at the transmitter-side in the system depicted in FIG. 1, or at optical transmitter 702, or the transmitter side in the system depicted in FIG. 10. At 402, the system receives data for transmission. The data may be, e.g., user data or control data to be transmitted in the optical communication network. At 404, a three-dimensional error correction code is applied to the data. Examples of such codes are discussed with respect to FIG. 8 and graph 802. At 406, the error correction coded signal is modulated on to subcarriers, e.g., using QAM technology, as is described with respect to FIG. 8, constellation 804, FIG. 1 and FIG. 10. The modulated data is then processed, at 408, and transmitted over the network. The processing at 408 may include digital to analog conversion, polarization multiplexing, etc.

Figure 5:
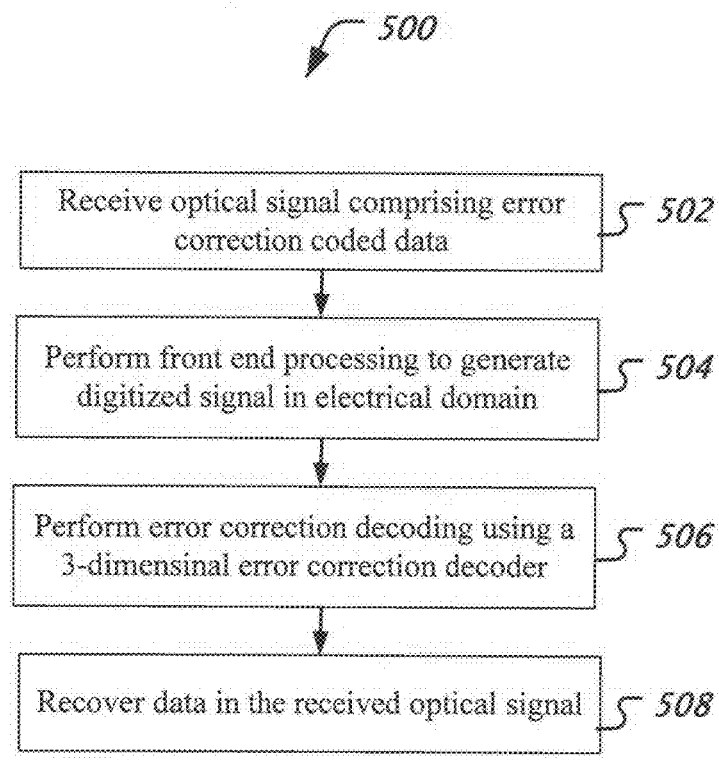
FIG. 5 shows an example optical signal reception method.

FIG. 5 shows an example optical signal reception method 500. The method 500 may be implemented at the receiver-side in the system depicted in FIG. 1, or at optical receiver 706 or the receiver-side of the system described in FIG. 10. At 602, an optical signal is received. The signal is modulated using error correction coded data where the 3-dimensional error correction code, e.g., described with respect to FIG. 8 and FIG. 4 is used. At 504, front end processing is performed on the received optical signal to generate a digitized signal in electrical domain. The front end processing may include polarization domain demultiplexing, channel estimation, analog to digital conversion, and so on. At 506, error correction decoding may be performed using the 2-dimensional error correction decoder, as described herein. At 508, modulated data is recovered from the received optical signal having undergone the error correction decoding.

Figures 6A, 6B:
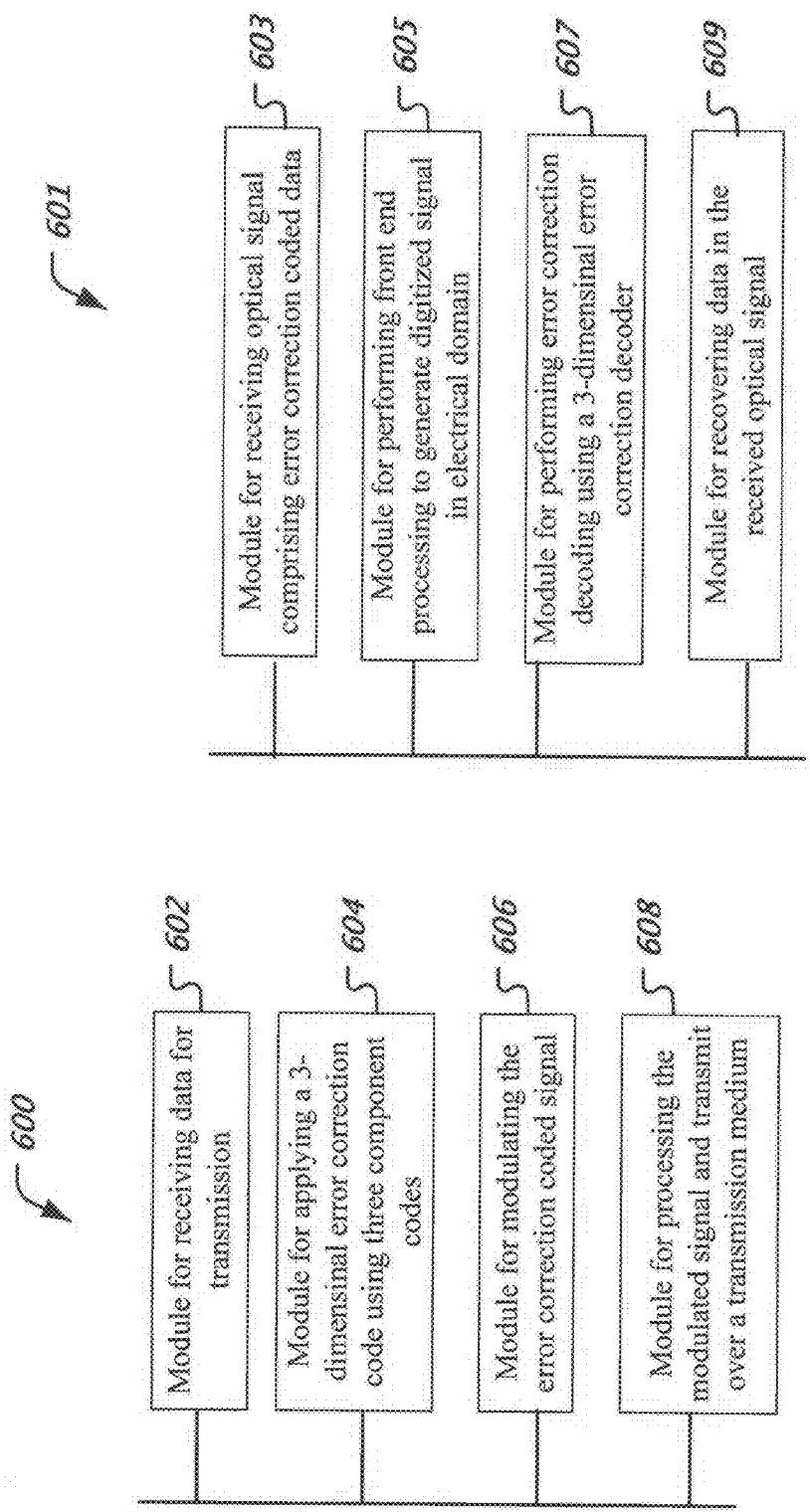
FIG. 6A and FIG. 6B show examples of optical communication transmission and reception apparatus.

FIG. 6A shows an apparatus 600 for transmitting optical signals. The apparatus 600 includes a module 602 for receiving data for transmission. The apparatus 600 also includes a module 604 for applying a 3-dimensional error correction code using three component codes. The apparatus 600 also includes a module 606 for modulating the error correction coded signal. The apparatus 600 includes a module 608 for processing the modulated signal and transmit over a transmission medium.

FIG. 6B shows an apparatus 601 for receiving error correction coded modulated optical signals. The apparatus 601 includes a module 603 for receiving optical signal comprising error correction coded data. The apparatus 601 includes a module 605 for performing front end processing to generate digitized signal in electrical domain. The apparatus 601 includes a module 607 for performing error correction decoding using a 3-dimensional error correction decoder. The apparatus 601 includes a module 609 for recovering data in the received optical signal.

It will be appreciated that a 3D TPCM scheme and demonstrated that, in the waterfall region, the proposed scheme outperforms the prior record-setting SPC-LDPC scheme and its theoretical limit by 0.6 dB and 0.45 dB, respectively. Transmission of 4×2×200 G TPCM channels over 2460 km EDFA-only SSMF link achieving error-free 4.8 b/s/Hz SE was successfully demonstrated. We applied union bound for error flare evaluation. We showed that focusing only on better waterfall performance is not always an effective coding strategy and reliable error flare estimation is necessary for performance assurance. Employing the union bound method we demonstrated that error flare can be effectively suppressed with a larger minimum distance in TPCM design. Due to its algebraic properties, the TPCM scheme is advantageous in utilizing theoretical analysis to satisfy code construction and error flare control that are not resolvable by simulations or measurements.

The disclosed and other embodiments and the functional operations and modules described in this document can be implemented in digital electronic circuitry, or in computer software, firmware, or hardware, including the structures disclosed in this document and their structural equivalents, or in combinations of one or more of them. The disclosed and other embodiments can be implemented as one or more computer program products, i.e., one or more modules of computer program instructions encoded on a computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them. A propagated signal is an artificially generated signal, e.g., a machine-generated electrical, optical, or electromagnetic signal, that is generated to encode information for transmission to suitable receiver apparatus.

A computer program (also known as a program, software, software application, script, or code) can be written in any form of programming language, including compiled or interpreted languages, and it can be deployed in any form, including as a stand alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this document can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of non volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

While this document contains many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. A method of optical communication, implemented at a transmitter in an optical communication network, comprising:
    receiving data for transmission over the optical communication network;
    applying a turbo product code to the data, resulting in a plurality of bits;
    grouping the plurality of bits, resulting in a first plurality of full symbols and a second plurality of partial symbols;
    applying a binary code to the first plurality of full symbols, resulting in a plurality of parity bits;
    combining the plurality of parity bits and the second plurality of partial symbols, resulting in a second plurality of full symbols;
    modulating the first and second plurality of full symbols using a modulation scheme, resulting in a modulated signal; and
    processing and transmitting the modulated signal over the optical communication network.

2. The method of claim 1, wherein at least one of the binary code and component codes of the turbo product code comprise a linear error correction code.

3. The method of claim 2, wherein at least one of the binary code and the component codes of the turbo product code is one of a single parity check (SPC) code, a BCH code or a Hamming code.

4. The method of claim 1, wherein the processing comprises:
    polarization multiplexing the modulated signal.

5. The method of claim 1, wherein the modulation scheme is a quadrature amplitude modulation (QAM) scheme with a modulation order m, wherein each of the first plurality of full symbols comprises m bits, wherein each of the second plurality of partial symbols comprises (m−1) bits, and wherein the QAM scheme uses a symbol constellation in which neighboring symbols differ by exactly one data bit.

6. A transmitter apparatus for operation in an optical communication network, comprising:
    a module for receiving data for transmission over the optical communication network;
    a module for applying a turbo product code to the data, resulting in a plurality of bits;
    a module for grouping the plurality of bits, resulting in a first plurality of full symbols and a second plurality of partial symbols;
    a module for applying a binary code to the first plurality of full symbols, resulting in a plurality of parity bits;
    a module for combining the plurality of parity bits and the second plurality of partial symbols, resulting in a second plurality of full symbols;
    a module for modulating the first and second plurality of full symbols using a modulation scheme, resulting in a modulated signal; and
    a module for processing and transmitting the modulated signal over the optical communication network.

7. The transmitter apparatus of claim 6, wherein at least one of the binary code and component codes of the turbo product code comprise a linear error correction code.

8. The transmitter apparatus of claim 7, wherein at least one of the binary code and the component codes of the turbo product code is one of a single parity check (SPC) code, a BCH code or a Hamming code.

9. The transmitter apparatus of claim 6, wherein the module for processing comprises:
    a module for polarization multiplexing the modulated signal.

10. The transmitter apparatus of claim 6, wherein the modulation scheme is a quadrature amplitude modulation (QAM) scheme with a modulation order m, wherein each of the first plurality of full symbols comprises m bits, wherein each of the second plurality of partial symbols comprises (m−1) bits, and wherein the QAM scheme is based on a symbol constellation in which neighboring symbols differ by exactly one data bit.

11. A method of optical communication, implemented at a receiver in an optical communication network, comprising:
    receiving, from the optical communication network, an optical signal comprising modulated data, the modulated data comprising a first plurality of symbols and a second plurality of symbols, the first plurality of symbols being based on a first portion of an output of a turbo product code, the second plurality of symbols being based on a second portion of the output of the turbo product code and a plurality of parity bits, the plurality of parity bits based on applying a binary code to the first portion of the output of the turbo product code;

performing front end processing on the optical signal to generate digitized samples of the optical signal;

performing error correction decoding on the digitized samples; and recovering, after the error correction decoding, data from the error correction decoded digitized samples.

12. The method of claim 11, wherein at least one of the binary code and component codes of the turbo product code comprise a linear error correction code.

13. The method of claim 12, wherein at least one of the binary code and the component codes of the turbo product code is one of a single parity check (SPC) code, a BCH code or a Hamming code.

14. The method of claim 11, wherein the front end processing includes comprises:

polarization demultiplexing the modulated signal.

15. The method of claim 11, wherein the modulated data is modulated using a quadrature amplitude modulation (QAM) scheme, and wherein the QAM scheme comprises a symbol constellation in which neighboring symbols differ by exactly one data bit.

16. A receiver apparatus for operation in an optical communication network, comprising:

a module for receiving, from the optical communication network, an optical signal comprising modulated data, the modulated data comprising a first plurality of symbols and a second plurality of symbols, the first plurality of symbols based on a first portion of an output of a turbo product code, the second plurality of symbols based on a second portion of the output of the turbo product code and a plurality of parity bits, the plurality of parity bits based on applying a binary code to the first portion of the output of the turbo product code;

a module for performing front end processing on the optical signal to generate digitized samples of the optical signal;

a module for performing error correction decoding on the digitized samples; and a module for recovering data from the error correction decoded digitized samples.

17. The receiver apparatus of claim 16, wherein at least one of the binary code and component codes of the turbo product code comprise a linear error correction code.

18. The receiver apparatus of claim 17, wherein the at least one of the binary code and the component codes of the turbo product code is one of a single parity check (SPC) code, a BCH code or a Hamming code.

19. The receiver apparatus of claim 16, wherein the module for front end processing comprises:

a module for polarization demultiplexing the modulated signal.

20. The receiver apparatus of claim 16, wherein the modulated data is modulated using a quadrature amplitude modulation (QAM) scheme, and wherein the QAM scheme comprises a symbol constellation in which neighboring symbols differ by exactly one data bit.

* * * * *